United States Patent
Park et al.

(10) Patent No.: US 9,191,010 B2
(45) Date of Patent: Nov. 17, 2015

(54) SEMICONDUCTOR DEVICE AND SEMICONDUCTOR SYSTEM INCLUDING THE SAME

(71) Applicant: SK hynix Inc., Gyeonggi-do (KR)

(72) Inventors: Ga-Ram Park, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/487,858

(22) Filed: Sep. 16, 2014

(65) Prior Publication Data
US 2015/0256183 A1    Sep. 10, 2015

(30) Foreign Application Priority Data

Mar. 5, 2014  (KR) .................. 10-2014-0025959

(51) Int. Cl.
  *G11C 7/22*   (2006.01)
  *H03K 21/02*  (2006.01)
  *H03L 7/24*   (2006.01)

(52) U.S. Cl.
  CPC ............. *H03K 21/023* (2013.01); *G11C 7/222* (2013.01); *H03L 7/24* (2013.01)

(58) Field of Classification Search
  CPC .................. G11C 7/22; G11C 7/222
  See application file for complete search history.

(56) References Cited

U.S. PATENT DOCUMENTS

| | | | | |
|---|---|---|---|---|
| 7,209,396 B2 * | 4/2007 | Schnell | ........ | G11C 7/22 365/191 |
| 7,902,887 B2 * | 3/2011 | Bae | ........ | G11C 7/22 327/147 |
| 8,917,113 B1 * | 12/2014 | Song | ........ | G01R 25/00 327/12 |

FOREIGN PATENT DOCUMENTS

KR    1020090107126    10/2009

* cited by examiner

*Primary Examiner* — Patrick O'Neill
(74) *Attorney, Agent, or Firm* — IP & T Group LLP

(57) ABSTRACT

A semiconductor device includes a clock division block suitable for dividing a frequency of a source clock and generating first and second internal clocks; a strobe division block suitable for dividing a frequency of a strobe signal, and generating first and second internal strobe signals; and a phase difference detection block suitable for generating and alternately outputting first and second detection information as a detection result information.

14 Claims, 7 Drawing Sheets

SEMICONDUCTOR DEVICE AND SEMICONDUCTOR SYSTEM INCLUDING THE SAME

CROSS-REFERENCE TO RELATED APPLICATIONS

The present application claims priority of Korean Patent Application No. 10-2014-0025959, filed on Mar. 5, 2014, which is incorporated herein by reference in its entirety.

BACKGROUND

1. Field

Various exemplary embodiments of the present invention relate to a semiconductor design technology and, more particularly, to a semiconductor device capable of phase difference detection and a semiconductor system including the same.

2. Description of the Related Art

Semiconductor devices include many units for performing various operations.

As the operation speed of semiconductor devices increases, operation signals that are commonly transmitted to different operation units may not arrive at same time because the signals have different lengths to travel or the signal transmission lines may have different characteristics that affect signal transmission speed. Therefore, signal synchronization and signal phase difference detection are required for signal synchronization.

SUMMARY

Various exemplary embodiments of the present invention are directed to a semiconductor device capable of signal phase difference detection for synchronization of signals with improved reliability and stability, and a semiconductor system including the same.

In an embodiment of the present invention, a semiconductor device may include: a clock division block suitable for dividing a frequency of a source clock to a preset rate and generating first and second internal clocks, which have a first phase difference from each other; a strobe division block suitable for dividing a frequency of a strobe signal to the preset rate and generating first and second internal strobe signals, which have a second phase difference from each other; and a phase difference detection block suitable for generating and alternately outputting first and second detection information as a detection result information, wherein the first detection information represents a combination of logic values of the first and second internal clocks detected at an edge of the first internal strobe signal, and wherein the second detection information represent a combination of logic values of the first and second internal clocks detected at an edge of the second internal strobe signal.

Activation periods of the first and second internal clocks may overlap with each other.

The first phase difference may be 90°, and the second phase difference may be 180°.

The preset rate may be a half rate of the source clock.

The phase difference detection block may include a first detection information generation unit suitable for generating the first detection information by detecting the logic values of the first and second internal clocks at the edge of the first internal strobe signal, and combining the detected logic values through an exclusive OR operation; a second detection information generation unit suitable for generating the second detection information by detecting the logic values of the first and second internal clocks at the edge of the second internal strobe signal, and combining the detected logic values through an exclusive OR operation; and a detection information output unit suitable for alternately outputting the first and second detection information as the detection result information.

The first and second internal strobe signals may alternately activate, and the detection information output unit may alternately output the first and second detection information in response to the alternate activation of the first and second internal strobe signals.

The detection information output unit may include a select signal generation section suitable for generating a select signal, which toggles between first and second logic levels in response to alternate activation of the first and second internal strobe signals; and an output selection section suitable for alternately outputting the first and second detection information according to the logic levels of the select signal.

In an embodiment of the present invention, a semiconductor system may include: a semiconductor controller suitable for outputting a source clock and a strobe signal; and a semiconductor device suitable for receiving the source clock and the strobe signal, and generating and outputting a detection result information representing a lead/lag relationship between the received source clock and the received strobe signal to the semiconductor controller, wherein the semiconductor device comprises: a clock division block suitable for dividing a frequency of the received source clock to a preset rate, and generating first and second internal clocks, which have a first phase difference from each other; a strobe division block suitable for dividing a frequency of the received strobe signal to the preset rate, and generating first and second internal strobe signals, which have a second phase difference from each other; and a phase difference detection block suitable for generating and alternately outputting first and second detection information as the detection result information, wherein the first detection information represents a combination of logic values of the first and second internal clocks detected at an edge of the first internal strobe signal, and wherein the second detection information represent a combination of logic values of the first and second internal clocks detected at an edge of the second internal strobe signal, and wherein the semiconductor controller adjusts a phase of the source clock or the strobe signal according to the detection result information.

Activation periods of the first and second internal clocks may overlap with each other.

The first phase difference may be 90°, and the second phase difference may be 180°.

The preset rate may be a half rate of the received source clock.

The phase difference detection block may include a first detection information generation unit suitable for generating the first detection information by detecting the logic values of the first and second internal clocks at the edge of the first internal strobe signal, and combining the detected logic values through an exclusive OR operation; a second detection information generation unit suitable for generating the second detection information by detecting the logic values of the first and second internal clocks at the edge of the second internal strobe signal, and combining the detected logic values through an exclusive OR operation; and a detection information output unit suitable for alternately outputting the first and second detection information as the detection result information.

The first and second internal strobe signals may alternately activate, and the detection information output unit may alternately output the first and second detection information in response to the alternate activation of the first and second internal strobe signals The detection information output unit may include a select signal generation section suitable for generating a select signal, which toggles between first and second logic levels in response to alternate activation of the first and second internal strobe signals; and an output selection section suitable for alternately outputting the first and second detection information according to the logic levels of the select signal.

According to the exemplary embodiments of the present invention, the phase difference detection is performed without edge detection but with value sampling of target signals, whereby the reliability and stability of the phase difference detection may be improved.

Moreover, a precise phase comparison between the target signals may be obtained regardless of a phase distortion of the target signals.

DETAILED DESCRIPTION

Figure 1:
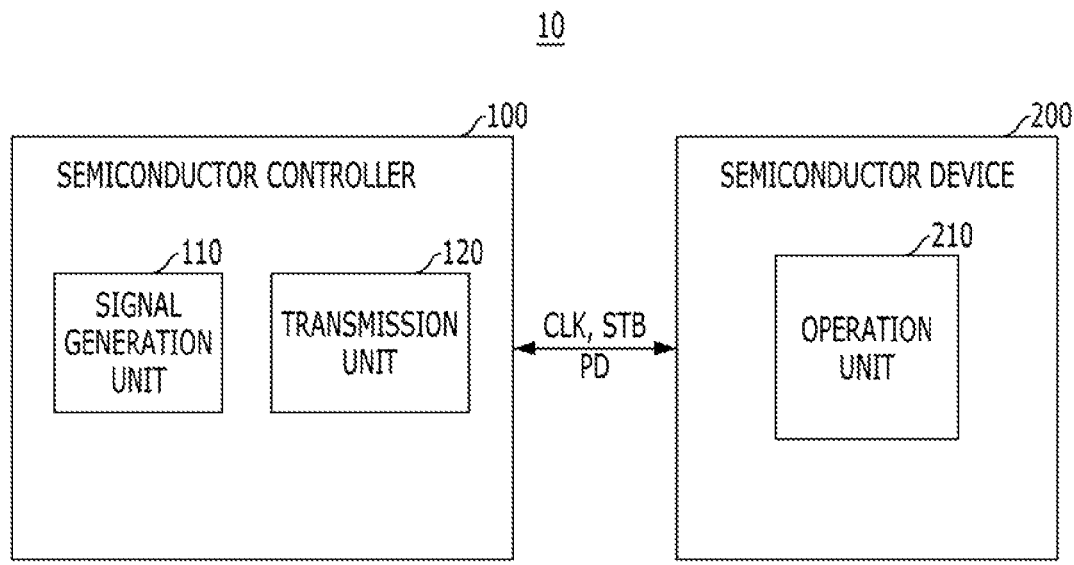
FIG. 1 is a block diagram illustrating a semiconductor system in accordance with an exemplary embodiment of the present invention.

Various embodiments of the present invention will be described below in more detail with reference to the accompanying drawings. The present invention may, however, be embodied in different forms and should not be construed as limited to the embodiments disclosed herein. Rather, these embodiments are provided so that this disclosure will be thorough and complete, and will fully convey the scope of the present invention to those skilled in the art. Throughout the disclosure, like reference numerals refer to like parts in the various figures and embodiments.

FIG. 1 is a block diagram illustrating a semiconductor system in accordance with an exemplary embodiment of the present invention.

Referring to FIG. 1, a semiconductor system 10 in accordance with an exemplary embodiment of the present invention may include a semiconductor controller 100 and a semiconductor device 200.

The semiconductor controller 100 may generate and transmit various control signals for controlling the semiconductor device 200. According to the embodiment of the present invention, the semiconductor controller 100 may include a signal generation unit 110 and a transmission unit 120.

The signal generation unit 110 may generate various signals including control signals. The signal generation unit 110 may provide a source clock CLK and a strobe signal STB to the semiconductor device 200, during a phase difference detection mode. The strobe signal STB may be a pulse generated at a specified time, and the source clock CLK may oscillate with a predetermined period.

During the phase difference detection mode, the semiconductor device 200 may detect phase differences between the source clock CLK and the strobe signal STB transferred from the semiconductor controller 100 to the semiconductor device 200. The semiconductor device 200 may transmit a result PD of the phase difference detection to the semiconductor controller 100.

The semiconductor controller 100 may control the phase of the source clock CLK or the strobe signal STB based on the result PD of the phase difference detection.

The transmission unit 120 may provide signals, which are generated by the signal generation unit 110, to the semiconductor device 200.

The semiconductor device 200 may include one or more operation units 210. The multiple operation units 210 may independently perform the same or different operations.

According to an exemplary embodiment of the present invention, the plurality of operation units 210 may be memory modules for storing data. The respective memory modules may operate independently of one another according to the control signals received from the semiconductor controller 100. The memory modules may include volatile and/or non-volatile memory cells for storing data.

For example, the multiple operation units 210 may communicate with the semiconductor controller 100 through a plurality of signal transmission lines.

The semiconductor controller 100 may transmit control signals to the plurality of operation units 210. For example, the control signals may include a clock signal, command/address signals, a strobe signal, and so forth.

The control signals may be commonly or individually provided to the operation units 210.

For example, the semiconductor controller 100 and the semiconductor device 200 may be separate chips, and may communicate with each other through signal transmission lines such as pins. In the semiconductor device 200, a common signal transmitted from the semiconductor controller 100 may be transferred to each of the multiple operation units 210 through a common internal path, while an individual signal transmitted from the semiconductor controller 100 may be transferred to an individual operation unit 210 through various internal paths for each of the multiple operation units 210.

Necessity for signal synchronization will be described below in detail with reference to FIG. 2.

Figure 2:
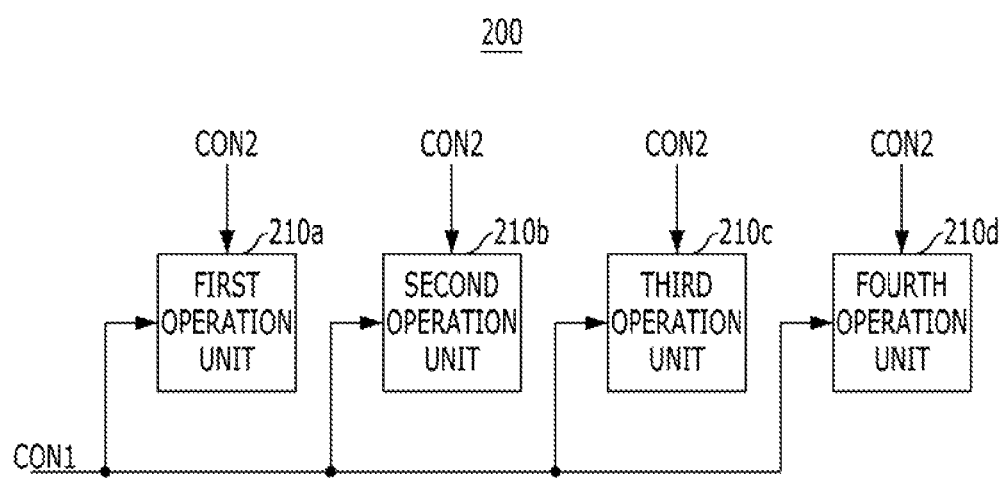
FIG. 2 is a block diagram illustrating synchronization of signals.

FIG. 2 is a block diagram illustrating synchronization of signals.

Referring to FIG. 2, a first control signal CON1 is provided commonly to the multiple operation units 210a, 210b, 210c and 210d through a common path, while a second control signal CON2 is individually provided to each of the multiple operation units 210a, 210b, 210c and 210d through respective paths.

Under ideal conditions, when the first and second control signals CON1 and CON2 are outputted from the semiconductor controller 100, the first control signal CON1 and the second control signal CON2 may keep a constant phase difference, which may be zero (0) or some other value, during their tour from the output of the semiconductor controller 100 to the respective operation units 210a, 210b, 210c and 210d.

In the real world, there may be various reasons for delays in the second control signal CON2 inputted to each of the multiple operation units 210. One reason for a delay is due to the variations of the individual paths to the operation units 210 that the second control signal CON2 must travel. However, there may not be delay differences in the first control signal CON1 inputted to the multiple operation units 210 through the common path.

As described above, phase difference detection is required in all of the multiple operation units 210a, 210b, 210c and 210d for signal synchronization.

For example, the first control signal CON1 may correspond to the source clock CLK, and the second control signal CON2 may correspond to the strobe signal STB.

Figure 3:
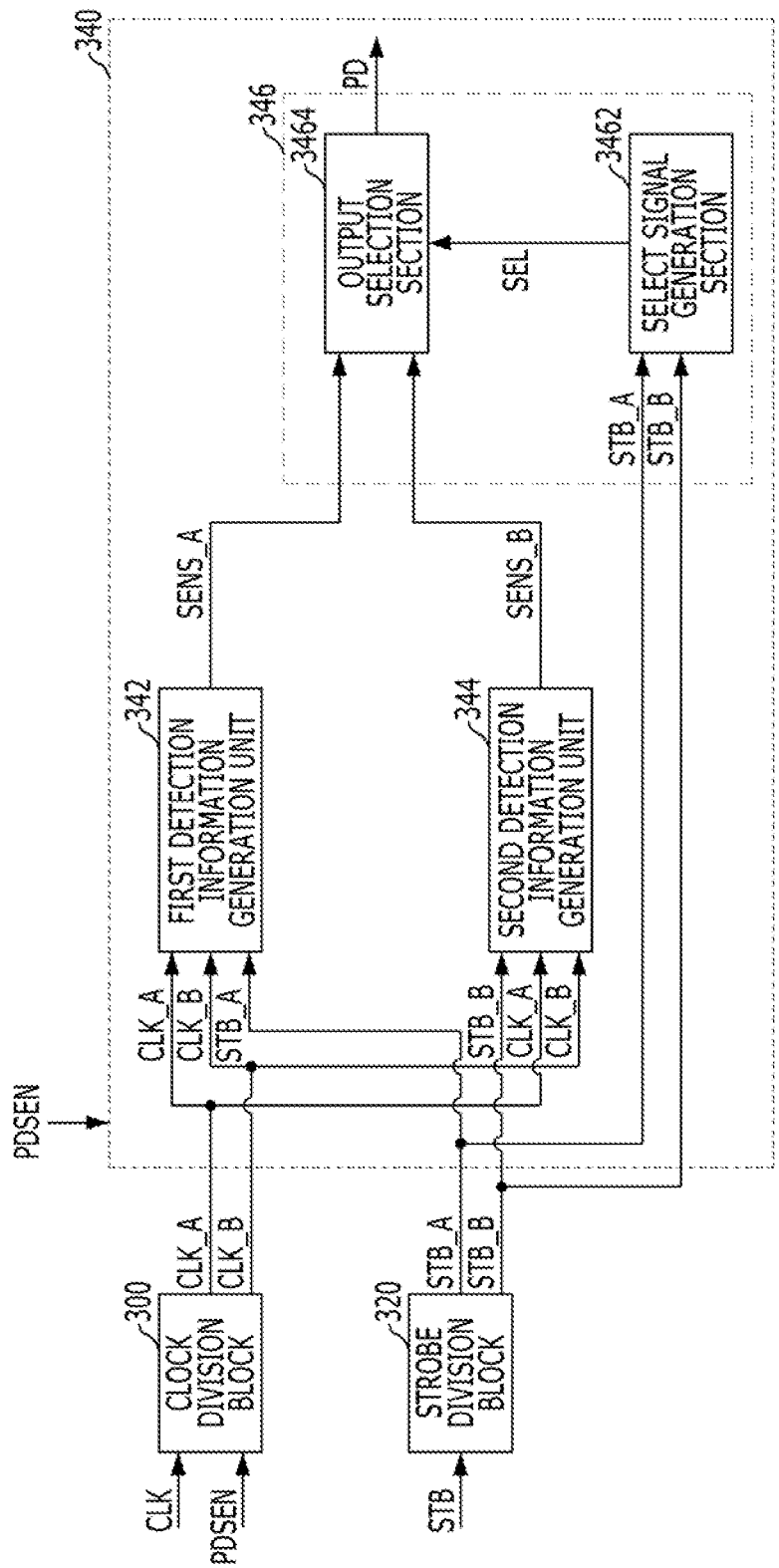
FIG. 3 is a block diagram illustrating a phase difference detection portion of a semiconductor device in accordance with an exemplary embodiment of the present invention.

FIG. 3 is a block diagram illustrating a phase difference detection portion of a semiconductor device in accordance with an exemplary embodiment of the present invention.

Referring to FIG. 3, the phase difference detection portion in a semiconductor device 200 in accordance with an exemplary embodiment of the present invention may include a clock division block 300, a strobe division block 320, and a phase difference detection block 340.

The clock division block 300 may operate in response to a mode signal PDSEN representing the phase difference detection mode. The clock division block 300 may divide the frequency of the source clock CLK at a predetermined rate, and generate a first internal clock. CLK_A and a second internal clock CLK_B, which have a first phase difference from each other.

The strobe division block 320 may divide the frequency of the strobe signal STB at a predetermined rate, and generate a first internal strobe signal STB_A and a second internal strobe signal STB_B, which have a second phase difference from each other.

Further, the clock division block 300 may generate the first and second internal clocks CLK_A and CLK_B from the source clock CLK in such a manner that the first and second internal clocks CLK_A and CLK_B have the first phase difference.

Also, the strobe division block 320 may generate the first and second internal strobe signals STB_A and STB_B from the strobe signal STB in such a manner that the first and second internal strobe signals STB_A and STB_B have the second phase difference.

In the phase difference detection mode, the clock division block 300 may generate the first and second internal clocks CLK_A and CLK_B such that the activation periods of the first and second internal clocks CLK_A and CLK_B overlap with each other, which means the first phase difference is not over 180°.

For example, in the phase difference detection mode, the clock division block 300 may divide the source clock CLK at a rate of ½, and generate the first and second internal clocks CLK_A and CLK_B, which have a phase difference of 90°, and thus overlap with each other.

For example, the strobe division block 320 may divide the strobe signal STB at the rate of ½, and generate the first and second internal strobe signals STB_A and STB_B, which have a phase difference of 180° and thus do not overlap with each other.

When the mode signal PDSEN is activated, the clock division block 300 may generate the first and second internal clocks CLK_A. and CLK_B, which have the first phase difference.

The phase difference detection block 340 may operate in response to the mode signal PDSEN. The phase difference detection block 340 may alternately output first and second detection information SENSA and SENS_B as detection result information PD. The first detection information SENS_A may be generated by combining logic levels of the first and second internal clocks CLK_A and CLK_B detected at a preset edge, for example, a rising edge, of the first internal strobe signal STB_A. The second detection information SENS_B may be generated by combining logic levels of the first and second internal clocks CLK_A and CLK_B detected at a preset edge, for example, a rising edge, of the second internal strobe signal STB_B.

The phase difference detection block 340 may include a first detection information generation unit 342, a second detection information generation unit 344, and a detection information output unit 346.

The first detection information generation unit 342 may generate the first detection information SENS_A by combining the logic levels of the first and second internal clocks CLK_A and CLK_B at the rising edge of the first internal strobe signal STB_A.

The second detection information generation unit 344 may generate the second detection information SENS_B by combining the logic levels of the first and second internal clocks CLK_A and CLK_B at the rising edge of the second internal strobe signal STB_B.

The detection information output unit 346 may alternately output the first and second detection information SENS_A and SENS_B as the detection result information PD.

The detection information output unit 346 may include a select signal generation section 3462, and an output selection section 3464.

The select signal generation section 3462 may generate a select signal SEL, which transitions to a first logic level in response to the preset edge, for example, the rising edge, of the first internal strobe signal STB_A, and transitions to a second logic level in response to the preset edge, for example, the rising edge, of the second internal strobe signal STB_B. As described above, the first and second internal strobe signals STB_A and STB_B may be generated by dividing the strobe signal STB to the preset rate, and the first and second internal strobe signals STB_A and STB_B may be alternately activated, which means that the activation durations of the first and second internal strobe signals STB_A and STB_B may not overlap.

The output selection section 3464 may alternately output the first and second detection information SENS_A and SENS_B as the detection result information PD during first and second logic level periods, for example, logic high and logic low level periods, of the select signal SEL, respectively. Thus, the output selection section 3464 may alternately output the first and second detection information SENS_A and SENS_B as the detection result information PD in response to the activations of the first and second internal strobe signals STB_A and STB_B, respectively.

Figure 4A:
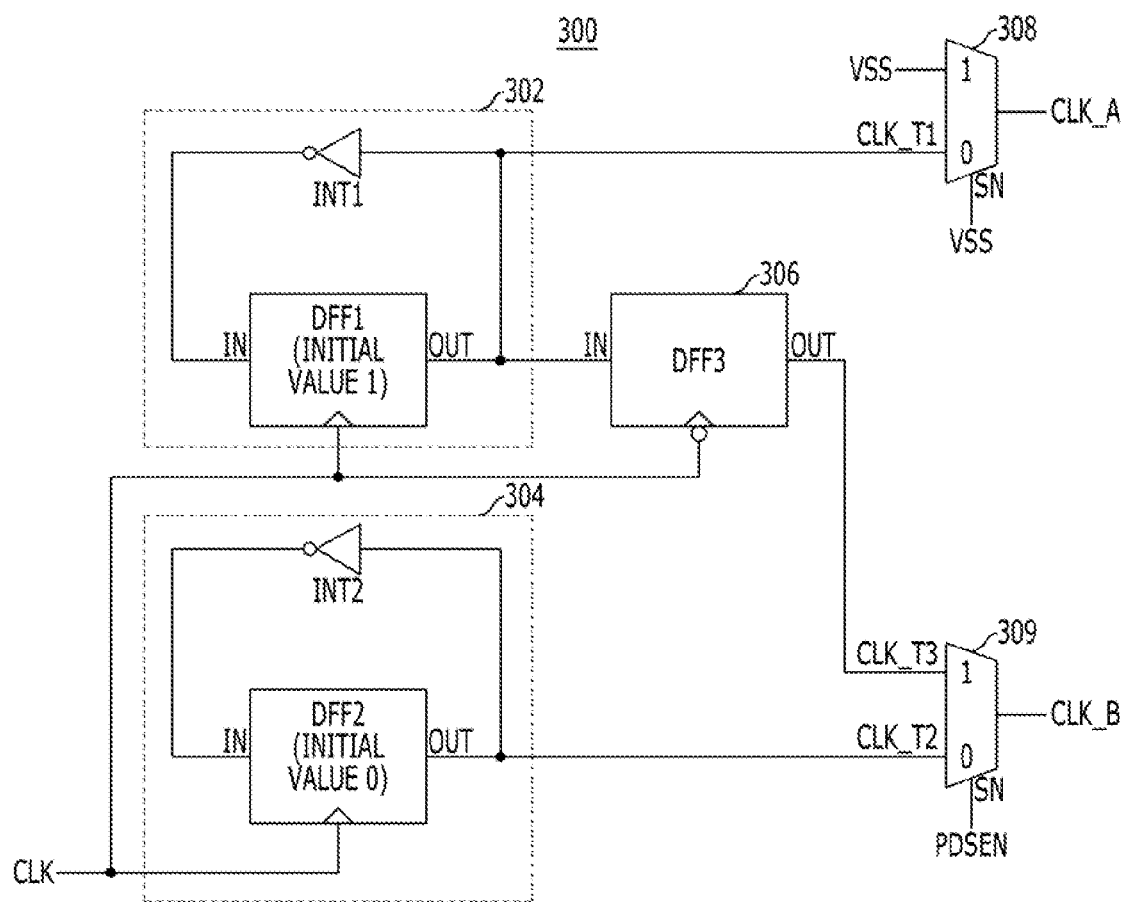
FIG. 4A is a circuit diagram illustrating a clock division block shown in FIG. 3.

FIG. 4A is a circuit diagram illustrating the clock division block 300 shown in FIG. 3.

Referring to FIG. 4A, the clock division block 300 may include a first intermediate clock generation unit 302, a second intermediate clock generation unit 304, a third intermediate clock generation unit 306, a first internal clock output unit 308, and a second internal clock output unit 309.

The first intermediate clock generation unit 302 may generate a first intermediate clock CLK_T1 by dividing the source clock CLK at the predetermined rate, for example, ½, at a rising edge of the source clock CLK. The first intermediate clock generation unit 302 may include a first flip-flop DFF1 and a first inverter INV1 on a feedback path of the first flip-flop DFF1. The first flip-flop DFF1 may output an input signal IN as an output signal OUT at every rising edge of the source clock CLK. The first flip-flop DFF1 may have a first initial value, for example, a value of '1'. The first inverter INT1 may invert the output signal OUT, and feedback the inverted output signal as the input signal IN of the first flip-flop DFF1. The first flip-flop DFF1 may output the first intermediate clock CLK_T1 or the output signal OUT at every rising edge of the source clock CLK, The first intermediate clock CLK_T1 may have a half frequency of the source clock CLK.

The second intermediate clock generation unit 304 may generate a second intermediate clock CLK_T2 by dividing the source clock CLK at the predetermined rate, for example, ½, at the source clock CLK. The second intermediate clock generation unit 304 may include a second flip-flop DFF2 and a second inverter INV2 on a feedback path of the second flip-flop DFF2. The second flip-flop DFF2 may output an input signal IN as an output signal OUT at every rising edge of the source clock CLK. The second flip-flop DFF2 may have a second initial value, for example, a value of '0'. The first and second initial values of the first flip-flop DFF1 and the second flip-flop DFF2 may be different from each other between the values of '0' and '1'. The second inverter INT2 may invert the output signal OUT, and feedback the inverted output signal as the input signal IN of the second flip-flop DFF1. The second flip-flop DFF2 may output the second intermediate clock CLK_T2, or the output signal OUT at every rising edge of the source clock CLK, The second intermediate clock CLK_T2 may have a half frequency of the source clock CLK.

Further, the first and second intermediate clocks CLK_T1 and CLK_T2 may have an inverted relationship, or may have a phase difference of 180° due to the different first and second initial values of the first flip-flop DFF1 and the second flip-flop DFF2 between the values of '0' and '1'.

The third intermediate clock generation unit 306 may receive and output the first intermediate clock CLK_T1 as a third intermediate clock CLK_T3 at every falling edge of the source clock CLK. The third intermediate clock generation unit 306 may include a third flip-flop DFF3, which outputs an input signal IN as an output signal OUT at every falling edge of the source clock CLK. Therefore, the third intermediate clock CLK_T3 may have a phase delay, which corresponds to the phase difference between the rising and falling edges of the source clock CLK, with reference to the first intermediate clock CLK_T1. For example, when the first internal clock CLK_A has a half rate of the source clock CLK, the first intermediate clock CLK_T1 and the third intermediate clock CLK_T3 may have phase difference of 90°.

The first internal clock output unit 308 may output the first intermediate clock CLK_T1 as the first internal clock CLK_A. The first internal clock output unit 308 may be a multiplexer, and receive a ground voltage VSS at its selection node SN, the first intermediate clock CLK_T1 at its first input node 0, and the ground voltage VSS at its second input node 1. The first intermediate clock CLK_T1 may always be selected according to the ground voltage VSS. Therefore, the first internal clock output unit 308 may always output the first intermediate clock CLK_T1 as the first internal clock CLK_A.

The second internal clock output unit 309 may output the third intermediate clock CLK_T3 as the second internal clock CLK_B in the phase difference detection mode. The second internal clock output unit 309 may be a multiplexer, and receive the mode signal PDSEN at its selection node SN, the second intermediate clock CLK_T2 at its first input node 0, and the third intermediate clock CLK_T3 at its second input node 1. When the mode signal PDSEN is activated to a logic high level, the second internal clock output unit 309 may output the third intermediate clock CLK_T3 as the second internal clock CLK_B. When the mode signal PDSEN is deactivated to a logic low, the second internal clock output unit 309 may output the second intermediate clock CLK_T2 as the second internal clock CLK_B. Therefore, the second internal clock output unit 309 may output the third intermediate clock CLK_T3 as the second internal clock CLK_B in the phase difference detection mode.

Accordingly, the clock division block 300 may output the first intermediate clock CLK_T1 as the first internal clock CLK_A, and the third intermediate clock CLK_T3 as the second Internal clock CLK_B in the phase difference detection mode. As described above, the first intermediate clock CLK_T1. and the third intermediate clock CLK_T3 may have a phase difference corresponding to phase difference between the rising and falling edges of the source clock CLK, for example, a phase difference of 90° when the first internal clock CLK_A has a half rate of the source clock CLK.

Figure 4B:
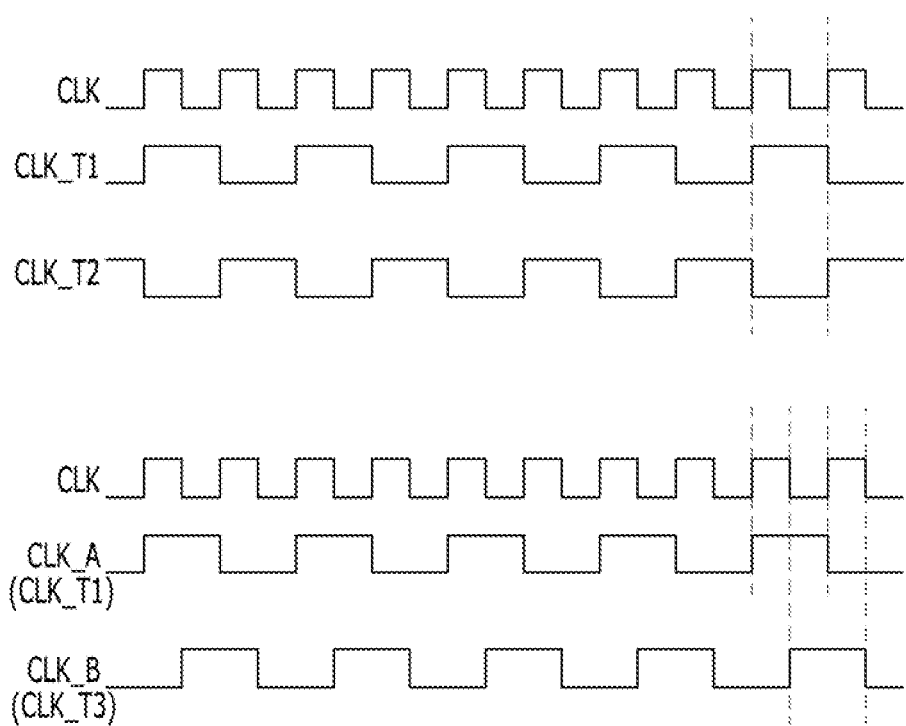
FIG. 4B is a timing diagram illustrating an operation of a clock division block shown in FIG. 4A.

FIG. 4B is a timing diagram illustrating an operation of the clock division block 300 shown in FIG. 4A, FIG. 4B shows the operation of the clock division block 300 in the phase difference detection mode.

Referring to FIG. 4B, for example, the clock division block 300 may divide the source clock CLK at the rate of ½, and generate the first and second intermediate clocks CLK_T1 and CLK_T2 having the phase difference of 180°.

Further, the clock division block 300 may generate the first and second internal clocks CLK_A and CLK_B having a phase difference of 90°.

Figure 5A:
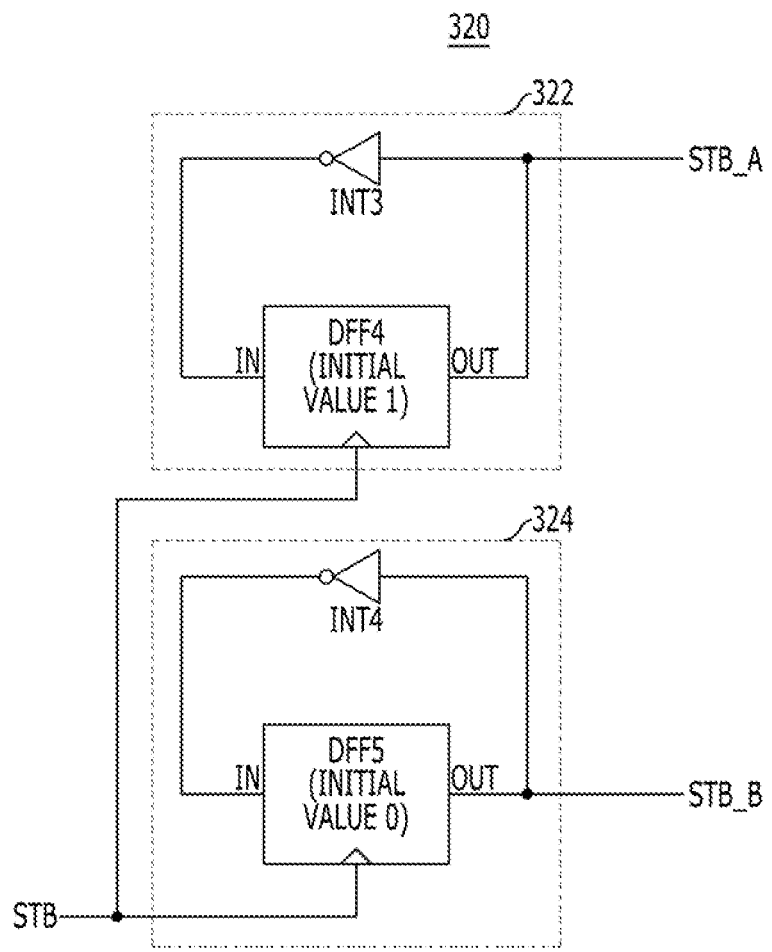
FIG. 5A is a circuit diagram illustrating a strobe division block shown in FIG. 3.

FIG. 5A is a circuit diagram illustrating the strobe division block 320 shown in FIG. 3.

Referring to FIG. 5A, the strobe division block 320 may include a first internal strobe signal generation unit 322 and a second internal strobe signal generation unit 324.

The first and second internal strobe signal generation units 322 and 324 may respectively be the same as the first and second intermediate clock generation units 302 and 304, which are described above with reference to FIGS. 4A and 4B, except for their input and output signals.

The first and second internal strobe signal generation units 322 and 324 may generate the first and second internal strobe signals STB_A and STB_B respectively, by dividing the strobe signal STB at the predetermined rate, for example, ½, at a rising edge of the strobe signal STB. First and second initial values of the fourth flip-flop DFF4 and the fifth flip-flop DFF5 of the first and second internal strobe signal generation units 322 and 324 may be different from each other between the values of '0' and 'T'. For example, the fourth flip-flop DFF4 may have the first initial value of '1', and the fifth flip-flop DFF5 may have the second initial value of '0'.

The first and second internal strobe signals STB_A and STB_B may have a half frequency of the strobe signal STB. Further, the first and second internal strobe signals STB_A and STB_B may have an inverted relationship, or may have a phase difference of 180° due to the different first and second initial values of the fourth flip-flop DFF4 and the fifth flip-flop DFF5 between the values of '0' and '1'.

Figure 5B:
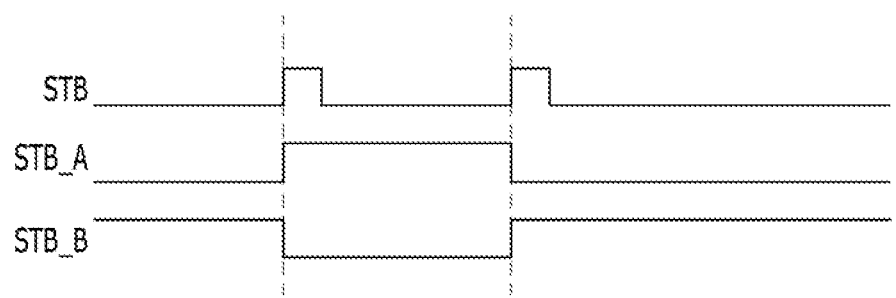
FIG. 5B is a timing diagram illustrating an operation of a strobe division block shown in FIG. 5A.

FIG. 5B is a timing diagram illustrating an operation of a strobe division block shown in FIG. 5A.

As can be seen from FIG. 5B, the relationship among the strobe signal STB and the first and second internal strobe signals STB_A and STB_B may be similar to the source clock CLK and the first and second intermediate clocks CLK_T1 and CLK_T2, which are described above with reference to FIGS. 4A and 4B, except for their periods and durations.

Figure 6:
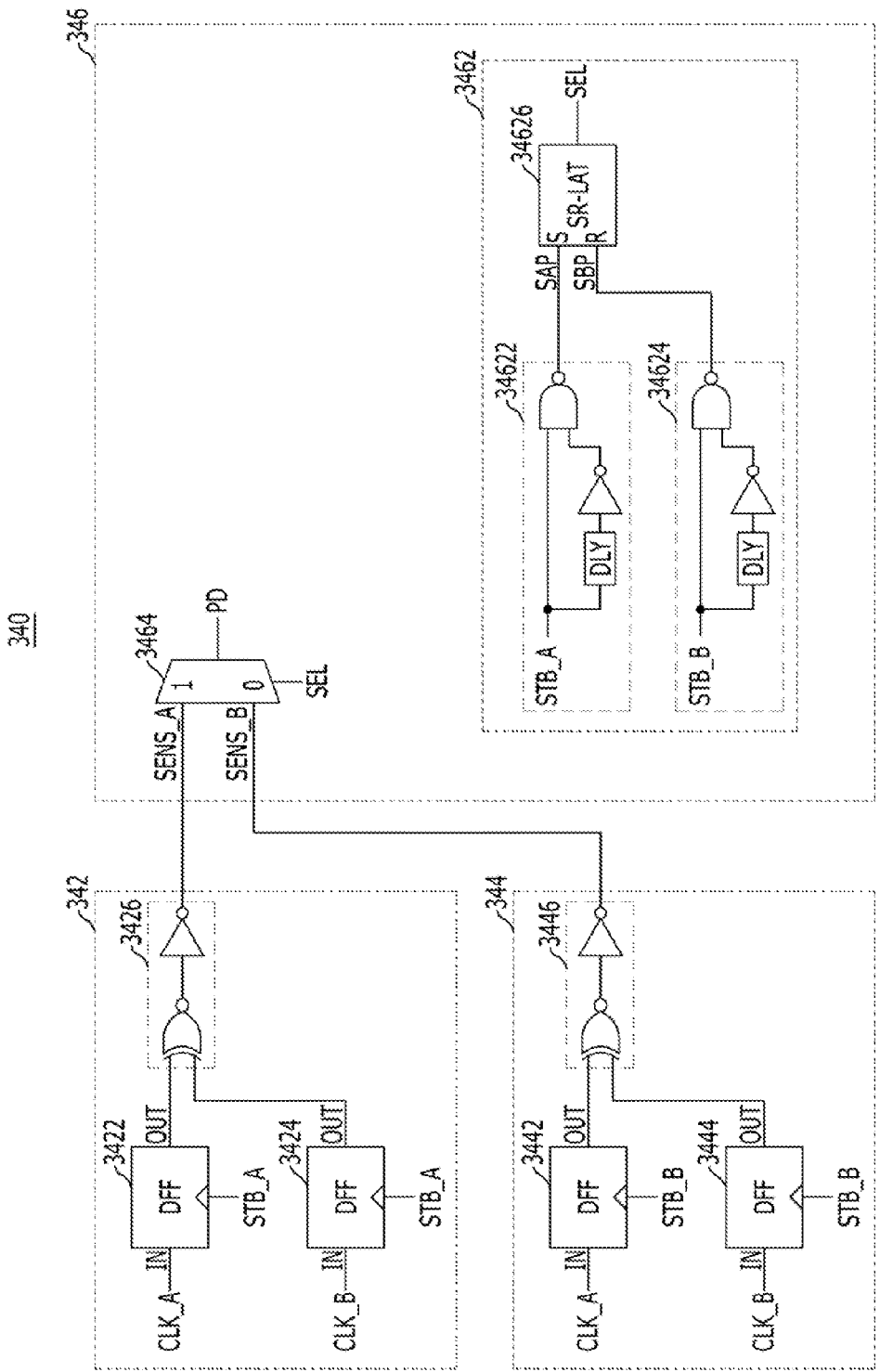
FIG. 6 is a circuit diagram illustrating a phase difference detection block shown in FIG. 3.

FIG. 6 is a circuit diagram illustrating the phase difference detection block 340 shown in FIG. 3.

Referring to FIG. 6, the first detection information generation unit 342 may include a first phase detecting section 3422, a second phase detecting section 3424, and a first combining section 3426. The second detection information generation unit 344 may include a third phase detecting section 3442, a fourth phase detecting section 3444, and a second combining section 3446 The select signal generation section 3462 may include a first pulse generation part 34622, a second pulse generation part 34624, and a select signal output part 34626.

The first detection information generation unit 342 may generate the first detection information SENS_A by combining the logic values of the first and second internal clocks CLK_A and CLK_B detected at the rising edge of the first internal strobe signal STB_A.

The first phase detecting section 3422 may be a flip-flop, and transfer the first internal clock CLK_A applied to an input node IN to an output node OUT in response to the rising edge of the first internal strobe signal STB_A. That is to say, the first phase detecting section 3422 determines which logic level the first internal clock CLK_A has at the rising edge of the first internal strobe signal STB_A.

The second phase detecting section 3424 may be a flip-flop, and transfer the second internal clock CLK_B applied to an input node IN to an output node OUT in response to the rising edge of the first internal strobe signal STB_A That is to say, the second phase detecting section 3424 determines which logic level the second internal clock CLK_B has at the rising edge of the first internal strobe signal STB_A.

The first combining section 3426 may combine the output result of the first phase detecting section 3422, and the output result of the second phase detecting section 3424, and may output the first detection information SENS_A. In other words, the first combining section 3426 may perform an exclusive OR operation to the output result of the first phase detecting section 3422, and the output result of the second phase detecting section 3424, and may output the logic level of the first detection information SENS_A.

The second detection information generation unit 344 may generate the second detection information SENS_B by combining the logic values of the first and second internal clocks CLK_A and CLK_B detected at the rising edge of the second internal strobe signal STB_B.

The second detection information generation unit 344 may operate in the same way as the first detection information generation unit 342 described above. The second detection information generation unit 344 may output the logic level of the second detection information SENS_B.

The detection information output unit 346 may alternately output the first and second detection information SENS_A and SENS_B as the detection result information PD in response to the activations of the first and second internal strobe signals STB_A and STB_B, respectively. As described above, the first and second internal strobe signals STB_A and STB_B may be generated by dividing the strobe signal STB at the preset rate, and the first and second internal strobe signals STB_A and STB_B may be alternately activated, which means that the activation durations of the first and second internal strobe signals STB_A and STB_B may not overlap, The detection information output unit 346 may output the first detection information SENS_A as the detection result information PD in response to the activation of the first internal strobe signal STB_A, and may output the second detection information SENS_B as the detection result information PD in response to the activation of the second internal strobe signal STB_B.

The select signal generation section 3462 may generate the select signal SEL, which transitions to the first logic level in response to the rising edge of the first internal strobe signal STB_A, and transitions to the second logic level in response to the rising edge of the second internal strobe signal STB_B.

The first pulse generation part 34622 may detect the rising edge of the first internal strobe signal STB_A, and may generate a first pulse SAP, which toggles for a predetermined time DLY.

The second pulse generation part 34624 may detect the rising edge of the second internal strobe signal STB_B, and may generate a second pulse SBP, which toggles for a predetermined time DLY.

The select signal output part 34626 may include an SR latch SR-LAT, which receives the first pulse SAP through a set input terminal S, and the second pulse SBP through a reset input terminal R, and outputs the select signal SEL. The select signal output part 34626 may output the select signal SEL, which is set to the first logic level in response to the first pulse SAP, and is set to the second logic level in response to the second pulse SBP.

The output selection section 3464 may output the first detection information SENS_A as the detection result information PD during the first logic level period of the select signal SEL, and output the second detection information SENS_B as the detection result information PD during the second logic level period of the select signal SEL.

Figure 7:
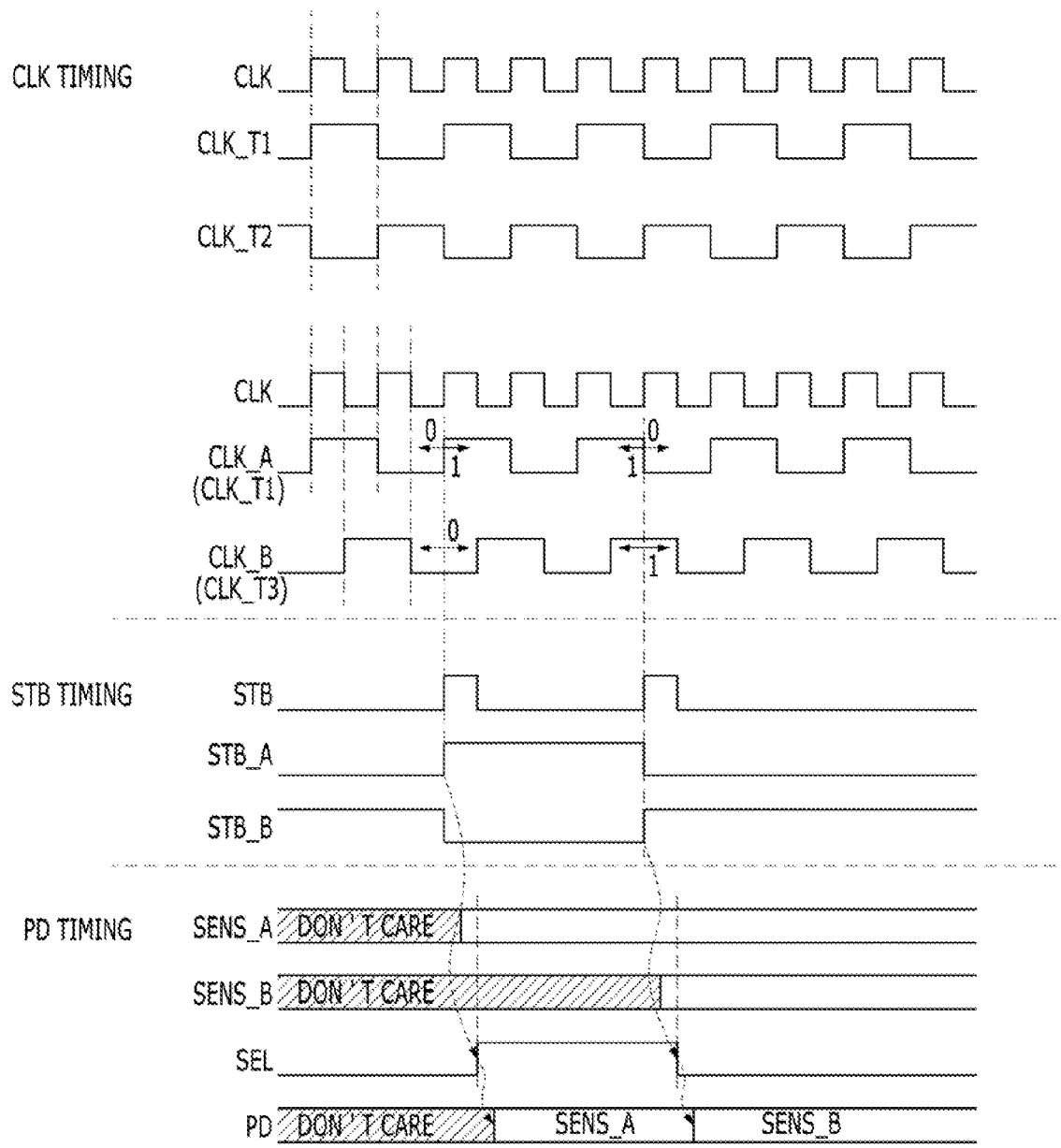
FIG. 7 is a timing diagram illustrating an operation of a phase difference detection portion shown in FIG. 3.

FIG. 7 is a timing diagram illustrating an operation of a phase difference detection portion shown in FIG. 3.

FIG. 7 shows three groups of timing diagrams, that is, a clock timing diagram, a strobe timing diagram and a phase difference detection timing diagram. The clock and strobe timing diagrams correspond to the timing diagrams described with reference to FIGS. 4B and 5B, respectively.

For example, the first and second internal clocks CLK_A and CLK_B may have a phase difference of 90° in the phase difference detection mode.

For example, the strobe signal STB may be synchronized with the rising edge of the source clock CLK. Accordingly, the rising edges of the first and second internal strobe signals STB_A and STB_B may also be synchronized with the rising edge of the source clock CLK. When the strobe signal STB is inputted at every 4th cycle (4 tck) of the source clock CLK, the rising edge of the first internal strobe signal STB_A may be synchronized with the rising edge of the first internal clock CLK_A while the rising edge of the second internal strobe signal STB_B may be synchronized with the falling edge of the first internal clock CLK_A.

Referring to the phase difference detection timing diagram shown in FIG. 7, the phase difference detection block 340 may alternately output first and second detection information SENSA and SENS_B as the detection result information PD according to the select signal SEL. The first detection information SENS_A may be generated by combining logic levels of the first and second internal clocks CLK_A and CLK_B detected at the rising edge of the first internal strobe signal STB_A. The second detection information SENSB may be generated by combining logic levels of the first and second internal clocks CLK_A and CLK_B detected at the rising edge of the second internal strobe signal STB_B.

As can be seen from FIG. 7, the logic values of the first. internal clock CLK_A detected at the rising edges of the first and second internal strobe signals STB_A and STB_B are different from each other between the values of '0' and '1' because of different periods of the strobe signal STB and the source clock CLK. FIG. 7 shows the strobe STB having a period corresponding to odd multiples of the period of the source clock CLK. FIG. 7 shows the strobe signal STB inputted at every 4th cycle (4 tck) of the source clock CLK, and thus having a period corresponding to 3 times that of the period of the source clock CLK.

For example, in an operation unit in the semiconductor device 200, when the strobe signal STB leads the source clock CLK within a half period of the source clock CLK, which corresponds to a quarter period of the first or second internal clocks CLK_A or CLK_B when the first or second internal clocks CLK_A or CLK_B have a half rate of the source clock CLK, the logic value '0' of the first internal clock CLK_A is detected at the rising edge of the first internal strobe signal STB_A while the logic value '1' of the first internal clock CLK_A is detected at the rising edge of the second internal strobe signal STB_B.

Conversely, in an operation unit in the semiconductor device 200, when the strobe signal STB lags behind the source clock. CLK within a half period of the source clock CLK, which corresponds to a quarter period of the first or second internal clocks CLK_A or CLK_B when the first or second internal clocks CLK_A or CLK_B have a half rate of the source clock CLK, the logic value '1' of the first internal clock CLK_A is detected at the rising edge of the first internal strobe signal STB_A while the logic value '0' of the first internal clock CLK_A is detected at the rising edge of the second internal strobe signal STB_B.

It is when the source clock CLK and the strobe signal STB are synchronized with each other at an operation unit in the semiconductor device 200 that the detected logic value of the first internal clock CLK_A, at the rising edges of the first and second intern& strobe signals STB_A and STB_B, can be determined. It is the phase lead/lag relationship between the source clock CLK and the strobe signal STB that the detected logic value of the second internal clock CLK_B, at the rising edges of the first and second internal strobe signals STB_A and STB_B, may represent. In accordance with an exemplary embodiment of the present invention, the second internal clock CLK_B, which has a phase difference of 90° relative to the phase of the first internal clock CLK_A, may give information on the phase lead/lag relationship between the source clock CLK and the strobe signal STB.

The reason why such a determination is possible resides in the fact that the phase of the second internal clock CLK_B and the phase of the first internal clock CLK_A have a difference of 90°. In other words, the rising and falling edges of the first internal clock CLK_A occurs during the logic values of '0' and '1' of the second internal clock CLK_B respectively. Therefore, a combination of the detected logic values of the first and second internal clocks CLK_A and CLK_B at the rising edges of the first and second internal strobe signals STB_A and STB_B may reveal the synchronization relationship and the phase lead/lag relationship between the source clock CLK and the strobe signal STB at an operation unit in the semiconductor device 200.

For example, it is assumed that at an operation unit in the semiconductor device 200, the strobe signal STB leads or lags behind the source clock CLK within a half period of the source clock CLK, which corresponds to a quarter period of the first or second internal clock CLK_A or CLK_B when the first or second internal clocks CLK_A or CLK_B have a half rate of the source clock CLK. That is, it is assumed that a full range of phase difference between the source clock CLK and the strobe signal STB at an operation unit in the semiconductor device 200 corresponds to a single period of the source clock CLK, or a half period of the first or second internal clock CLK_A or CLK_B.

At an operation unit in the semiconductor device 200, when the strobe signal STB leads the source clock CLK within a half period of the source clock CLK, which corresponds to a quarter period of the first or second internal clocks CLK_A or CLK_B when the first or second internal clocks CLK_A or CLK_B have a half rate of the source clock CLK, both of the first and second internal clocks CLK_A and CLK_B may be detected to have the value of '0' at the rising edge of the first internal strobe signal STB_A. The combination of the detected logic values of the first and second internal clocks CLK_A and CLK_B at the rising edge of the first internal strobe signal STB_A, for example, a value of '0', results from an exclusive OR operation for the detected logic values of the first and second internal clocks CLK_A and CLK_B, at the rising edge of the first internal strobe signal STB_A, and may reveal that the strobe signal STB leads the source clock CLK within a half period of the source clock CLK at an operation unit in the semiconductor device 200. The combination of the detected logic values of the first and second internal clocks CLK_A and CLK_B at the rising edge of the second internal strobe signal STB_B may reveal the same result.

Conversely, at an operation unit in the semiconductor device 200, when the strobe signal STB lags behind the source clock CLK within a half period of the source clock CLK, which corresponds to a quarter period of the first or second internal clock CLK_A or CLK_B, when the first or second internal clock CLK_A or CLK_B has a half rate of the source clock CLK, the first and second internal clocks CLK_A and CLK_B may be detected to have the values of '1' and '0' at the rising edge of the first internal strobe signal STB_A, respectively. The combination of the detected logic values of the first and second internal clocks CLK_A and CLK_B at the rising edge of the first internal strobe signal STB_A, for example, a value of '1' resulted from an exclusive OR operation for the detected logic values of the first and second internal clocks CLK_A and CLK_B, at the rising edge of the first internal strobe signal STB_A, and may reveal that the strobe signal STB lags behind the source clock CLK within a half period of the source clock CLK at an operation unit in the semiconductor device 200. The combination of the detected logic values of the first and second internal clocks CLK_A and CLK_B at the rising edge of the second internal strobe signal STB_B may reveal the same result.

Meanwhile, the first detection information SENS_A may represent the synchronization relationship and the phase lead/lag relationship between the source clock CLK and a first pulse of the strobe signal STB at the rising edge of the first internal strobe signal STB_A or at the first pulse of the strobe signal STB, while the second detection information SENS_B may represent the synchronization relationship and the phase lead/lag relationship between the source clock CLK and a second pulse of the strobe signal STB at the rising edge of the second internal strobe signal STB_B or at the second pulse of the strobe signal STB. Therefore, the first and second detection information SENS_A and SENS_B may be alternately outputted as the as the detection result information PD to show the synchronization relationship and the phase lead/lag relationship between the source clock CLK and each pulse of the strobe signal STB.

To this end, the select signal SEL may be activated to a logic high in response to the rising edge of the first internal strobe signal STB_A, and deactivated to a logic low in response to the rising edge of the second internal strobe signal STB_B. The first detection information SENS_A may be outputted as the detection result information PD during activation of the select signal SEL, while the second detection information SENS_B may be outputted as the detection result information PD during deactivation of the select signal SEL.

As described above, according to the exemplary embodiments of the present invention, through the first and second internal clocks CLK_A and CLK_B having a phase difference of 90°, and the first and second internal strobe signals STB_A and STB_B having a phase difference of 180°, the phase difference detection may be performed not with edge detection but with the value sampling of target signals, whereby the reliability and stability of the phase difference detection may be improved. Moreover, a precise phase comparison between the target signals may be obtained regardless of phase distortion of the target signals.

Although various embodiments of the present invention have been described for illustrative purposes, it will be apparent to those skilled in the art that various changes and modifications may be made without departing from the spirit and scope of the invention as defined in the following claims.

For instance, the positions and type of logic gates and transistors exemplified in the above-described embodiments could be differently realized according to the polarities of the signals inputted thereto.

While it was described that the clock division block 300 may generate only the first and second internal clocks CLK_A and CLK_B, this is only an example. Other possibilities include a configuration that in which the clock division block 300 divides the source clock CLK and generates more than the two clocks CLK_A and CLK_B in such a manner that the two generated clocks are set to have a first phase difference allowing activation periods to overlap with each other or a second phase difference allowing activation periods to not overlap with each other, according to an operation period. For example, an extension may be made to a configuration in which the clock division block 300 divides the source clock CLK at a rate of ¼ and may generate first to fourth internal clocks (not shown) in such a manner that, among the first to fourth internal clocks, the first and third internal clocks are set to have a phase difference of 90°, allowing activation periods to overlap with each other, or a phase difference of 180°, not allowing activation periods to overlap with each other, according to an operation period. The second and fourth internal clocks may then be set to have a phase difference of 90°, allowing activation periods to overlap with each other or a phase difference of 180°, not allowing activation periods to overlap with each other, according to an operation period.

Similarly, while it was described that the strobe division block 320 may generate only first and second internal strobe signals STB_A and STB_B, this is also only an example. Other possible embodiments include a configuration in which the strobe division block 320 divides the strobe signal STB and may generate more than the two internal strobe signals STB_A and STB_B in such a manner that the two generated signals are set to have a second phase difference allowing activation periods that do not overlap with each other. For example, the strobe division block 320 divides the strobe signal STB at a rate of ¼ and may generate first to fourth internal strobe signals (not shown) in such a manner that, among the first to fourth internal strobe signals, the first and third internal strobe signals are set to have a phase difference of 180°, not allowing activation periods to overlap with each other, and the second and fourth internal strobe signals are set to have a phase difference of 180°, not allowing activation periods to overlap with each other.

As described above, the first phase difference means that activation periods are set to overlap with each other, and the second phase difference means that activation periods are set not to overlap with each other. Due to this fact, in the above-described embodiments of the present invention, the first phase difference was exemplified as a phase difference of 90°, and the second phase difference was exemplified as a phase difference of 180°. This also was only an example and other embodiments include a configuration in which all phase differences allowing the activation periods of two corresponding signals to overlap with each other are set to the first phase difference and all phase differences allowing the activation periods of two corresponding signals not to overlap with each other are set to the second phase difference.

On the other hand, according to the way in which the strobe signal STB is inputted, both the rising edge of the first internal strobe signal STB_A and the rising edge of the second internal strobe signal STB_B may be inputted with to be synchronized with the rising edge of the first internal clock CLK_A, and both the rising edge of the first internal strobe signal STB_A and the rising edge of the second internal strobe signal STB_B may be inputted with to be synchronized with the falling edge of the first internal clock CLK_A. Also, the rising edge of the first internal strobe signal STB_A may be inputted with to be synchronized with the falling edge of the first internal clock CLK_A, and the rising edge of the second internal strobe signal STB_B may be inputted with to be synchronized with the rising edge of the first internal clock. CLK_A. Namely, if the rising edge of the strobe signal STB is inputted to be synchronized with the rising edge of the source clock CLK, it is impossible to know in advance which type of first and second internal clocks CLK_A and CLK_B and the first and second internal strobe signals STB_A and STB_B are to be generated. Although it is shown in the drawing that the first and second internal clocks CLK_A and CLK_B are generated in such a manner that the rising edge of the first internal clock CLK_A is synchronized with the rising edge of the source clock CLK and the rising edge of the second internal clock CLK_B is synchronized with the falling edge of the source clock CLK, these is merely an example and a reverse case may be envisioned in many forms. Of course, if the first and second internal clocks CLK_A and CLK_B are generated according to the reverse case, the functions of the first and second internal clocks CLK_A and CLK_B will be reversed.

Although it was described in the embodiments that an exclusive OR operation is used to combine the value of the first intern& clock CLK_A and the value of the second internal clock CLK_B, which are detected at the rising edge of the first internal strobe signal STB_A or the rising edge of the second internal strobe signal STB_B, it is to be noted that this is only an example and other methods may be used according to the designer's choice.

What is claimed is:
1. A semiconductor device comprising:
a clock division block suitable for dividing a frequency of a source clock at a preset rate, and generating first and second internal clocks, which have a first phase difference from each other;
a strobe division block suitable for dividing a frequency of a strobe signal at the preset rate, and generating first and second internal strobe signals, which have a second phase difference from each other; and
a phase difference detection block suitable for generating and alternately outputting first and second detection information as detection result information, wherein the first detection information represents a combination of logic values of the first and second internal clocks detected at an edge of the first internal strobe signal, and wherein the second detection information represent a combination of logic values of the first and second internal clocks detected at an edge of the second internal strobe signal.

2. The semiconductor device according to claim 1, wherein activation periods of the first and second internal clocks overlap with each other.

3. The semiconductor device according to claim 2,
wherein the first phase difference is 90°, and
wherein the second phase difference is 180°.

4. The semiconductor device according to claim 2, wherein the preset rate is a half rate of the source clock.

5. The semiconductor device according to claim 1, wherein the phase difference detection block comprises:

a first detection information generation unit suitable for generating the first detection information by detecting the logic values of the first and second internal clocks at the edge of the first internal strobe signal, and combining the detected logic values through an exclusive OR operation;

a second detection information generation unit suitable for generating the second detection information by detecting the logic values of the first and second internal clocks at the edge of the second internal strobe signal, and combining the detected logic values through an exclusive OR operation; and a detection information output unit suitable for alternately outputting the first and second detection information as the detection result information.

6. The semiconductor device according to claim 5,
wherein the first and second internal strobe signals alternately activate, and
wherein the detection information output unit alternately outputs the first and second detection information in response to the alternate activation of the first and second internal strobe signals.

7. The semiconductor device according to claim 5, wherein the detection information output unit comprises:

a select signal generation section suitable for generating a select signal, which toggles between first and second logic levels in response to alternate activation of the first and second internal strobe signals; and an output selection section suitable for alternately outputting the first and second detection information according to the logic levels of the select signal.

8. A semiconductor system comprising:
a semiconductor controller suitable for outputting a source clock and a strobe signal; and
a semiconductor device suitable for receiving the source clock and the strobe signal, and generating and outputting a detection result information representing a lead/lag relationship between the received source clock and the received strobe signal to the semiconductor controller,
wherein the semiconductor device comprises:
a clock division block suitable for dividing a frequency of the received source clock at a preset rate, and generating first and second internal clocks, which have a first phase difference from each other;

a strobe division block suitable for dividing a frequency of the received strobe signal at the preset rate, and generating first and second internal strobe signals, which have a second phase difference from each other; and a phase difference detection block suitable for generating and in alternately outputting first and second detection information as the detection result information, wherein the first detection information represents a combination of logic values of the first and second internal clocks detected at an edge of the first internal strobe signal, and wherein the second detection information represents a combination of logic values of the first and second internal clocks detected at an edge of the second internal strobe signal, and wherein the semiconductor controller adjusts a phase of the source clock or the strobe signal according to the detection result information.

9. The semiconductor system according to claim 8, wherein, activation periods of the first and second internal clocks overlap with each other.

10. The semiconductor system according to claim 9,
wherein the first phase difference is 90°, and
wherein the second phase difference is 180°.

11. The semiconductor system according to claim 9, wherein the preset rate is a half rate of the received source clock.

12. The semiconductor system according to claim 8, wherein the phase difference detection block comprises:

a first detection information generation unit suitable for generating the first detection information by detecting the logic values of the first and second internal clocks at the edge of the first internal strobe signal, and combining the detected logic values through an exclusive OR operation;

a second detection information generation unit suitable for generating the second detection information by detecting the logic values of the first and second internal clocks at the edge of the second internal strobe signal, and combining the detected logic values through an exclusive OR operation; and a detection information output unit suitable for alternately outputting the first and second detection information as the detection result information.

13. The semiconductor system according to claim 12,
wherein the first and second internal strobe signals alternately activate, and
wherein the detection information output unit alternately outputs the first and second detection information in response to the alternate activation of the first and second internal strobe signals.

14. The semiconductor system according to claim 12, wherein the detection information output unit comprises:

a select signal generation section suitable for generating a select signal, which toggles between first and second logic levels in response to alternate activation of the first and second internal strobe signals; and an output selection section suitable for alternately outputting the first and second detection information according to the logic levels of the select signal.

* * * * *